United States Patent [19]

Lin

[11] Patent Number: 5,869,870
[45] Date of Patent: Feb. 9, 1999

[54] ELECTROSTATIC DISCHARGE (ESD) PROTECTIVE DEVICE FOR INTEGRATED CIRCUIT PACKAGES WITH NO-CONNECT PINS

[75] Inventor: Shi-Tron Lin, Taipei, Taiwan

[73] Assignee: Winbond Electronics Corp., Taiwan, Taiwan

[21] Appl. No.: 677,109

[22] Filed: Jul. 9, 1996

[30] Foreign Application Priority Data

Apr. 20, 1996 [TW] Taiwan .................................. 85104741

[51] Int. Cl.⁶ .............................. H01L 23/48; H01L 23/60
[52] U.S. Cl. .......................... 257/355; 257/786; 257/357
[58] Field of Search .................................. 257/356–357, 257/360–361, 786

[56] References Cited

U.S. PATENT DOCUMENTS 4,692,781  9/1987  Roundtree et al. ..................... 257/360
5,512,783  4/1996  Wakefield et al. ...................... 257/693
5,623,387  4/1997  Li et al. .................................. 257/355

OTHER PUBLICATIONS

Matsumoto, et al., "New Failure Mechanism due to Non–Wired Pin ESD Stressing", EOS/ESD Symposium 1994, pp. 2.5.1–2.5.6.

*Primary Examiner*—John Guay
*Attorney, Agent, or Firm*—Rabin & Champagne, P.C.

[57] ABSTRACT

An ESD protective device for protection of an integrated circuit (IC) package from electrostatic discharge damage. The ESD protective device protects the internal circuit of the IC connected to wired pins of the IC package against ESD damage due to ESD stress in neighboring no-connect pins. The ESD protective device includes an ESD protective unit coupled to the power bus and a bonding pad coupled between this ESD protective device and the no-connect pin. The ESD protective unit causes ESD stress applied to the no-connect pin to be diverted to the power bus, thus preventing ESD transfer between a no-connect pin and an active pin, which could damage the internal circuit.

13 Claims, 5 Drawing Sheets

ELECTROSTATIC DISCHARGE (ESD) PROTECTIVE DEVICE FOR INTEGRATED CIRCUIT PACKAGES WITH NO-CONNECT PINS

BACKGROUND OF THE INVENTION

1. Field of the Invention

The invention relates to electrostatic discharge (ESD) protection in integrated circuit (IC) packages, and more particularly, to ESD protective devices provided to selected no-connect pins on an IC package for protection of the IC package and internal circuit against ESD stress applied to the no-connect pins.

2. Description of Related Art

Electrostatic discharge (ESD) is a movement of static electricity from a nonconductive surface, which could cause damage to semiconductors and other circuit components in ICs. A person walking on a carpet, for instance, can carry an amount of electrostatic charge up to several thousands of volts under high humidity conditions and over 10,000 volts under low humidity conditions. When touching ICs by hand, the instantaneous power level of the ESD could cause severe damage to the ICs. CMOS (complementary metal-oxide semiconductor) logic ICs are especially vulnerable to ESD.

To protect IC packages against ESD damage, various solutions have been proposed. One solution suggests the provision of an ESD protective device between the internal semiconductor devices in the IC chip (hereinafter referred to as "internal circuit") and the corresponding bonding pad. FIG. 1 shows the wire connection in an IC package which includes bonding pads 11, 13, 15 electrically connected to the internal circuit of the IC package. A number of pins, or leads, for example, as those indicated by the reference numerals 10, 12, 14, 16, 17, 18, 19, are provided on the IC package, of which the pin 10 is a power pin (i.e., $V_{DD}$ or $V_{SS}$ pin) which is connected to the bonding pad 11 via a bonding wire 100, pin 12 is an I/O pin internally connected to the bonding pad 13 via bonding wire 120, pin 14 is an input pin internally connected to the bonding pad 15 via bonding wire 140, and the other pins 16, 17, 18, 19 are not in use and are thus referred to as no-connect pins. To prevent ESD current from flowing into the internal circuit via the pins 10, 12, 14, conventional ESD protective circuits (not shown) are provided between the bonding pads 11, 13, 15 and the internal circuit so as to divert the ESD current from entering the internal circuit.

A trend in IC packaging is to provide a larger number of pins with a smaller pitch between the pins to achieve a high packing density of I/O on the IC package. Thus, the gap (i.e., the pitch) between two adjacent pins, for example, as indicated by the reference numeral G in FIG. 1 between the pins 14 and 19, is reduced. This, however, causes new problems in providing ESD protection for the IC package, as discussed in detail in a paper entitled "New Failure Mechanism No-Connect Pin ESD Stressing" by Matsumoto of Japan in 1994 *EOS/ESD Symposium*, pp.90–95. The paper reveals the fact that, when a human body model (HBM) ESD pulse is repeatedly applied to a no-connect pin on the IC package, any of the two neighboring pins, if wired to the internal circuit, would become vulnerable to ESD damage. This is because the electrostatic charge will accumulate in the resin around the no-connect pin, resulting in a large potential difference between the no-connect pin and its neighboring pins, which would significantly reduce the ESD resistance capability of the neighboring pins.

Taking the IC package of FIG. 1 as an example, it will be assumed that the input pin 14 is able to withstand a maximum of ESD voltage of 3 kV. When an ESD voltage of 1.5 kV, for example, is received by the no-connect pin 19, the electrostatic charge will be accumulated in the resin around the no-connect pin 19, resulting in a large potential difference between the no-connect pin to its neighboring pins that would eventually cause an electrostatic discharge through the gap G to the neighboring wired pin 14, thus causing ESD damage to the internal circuit 20 via the bonding wire 140 and the bonding pad 15. Therefore, it is apparent that an ESD voltage having a significantly smaller magnitude than the maximum level withstandable by the wired pins, when received by a neighboring no-connect pins, could nonetheless cause ESD damage to the internal circuit via the wired pins. There exists, therefore, a need for an ESD protective device that is capable of protecting the wired pins against ESD due to ESD voltages received by neighboring no-connect pins.

SUMMARY OF THE INVENTION

It is therefore an objective of the invention to provide an ESD protective device in an IC package, which is capable of protecting an internal circuit connected to wired pins on the IC package against ESD damage due to ESD stress at neighboring no-connect pins.

In accordance with the foregoing and other objectives of the invention, a new and improved ESD protective device for ESD protection of an IC package is provided. The ESD protective device includes an ESD protective unit coupled to the IC power bus and a bonding pad coupled between the ESD protective device and the no-connect pin. The ESD protective unit causes the ESD stress applied at the associated no-connect pin to be diverted to the power bus, thus preventing ESD damage to the internal circuit due to a potential difference at a no-connect pin adjacent to an active pin.

BRIEF DESCRIPTION OF DRAWINGS

The invention can be more fully understood by reading the subsequent detailed description of the preferred embodiments, with reference made to the accompanying drawings, wherein.

DETAILED DESCRIPTION OF PREFERRED EMBODIMENT

Figure 1:
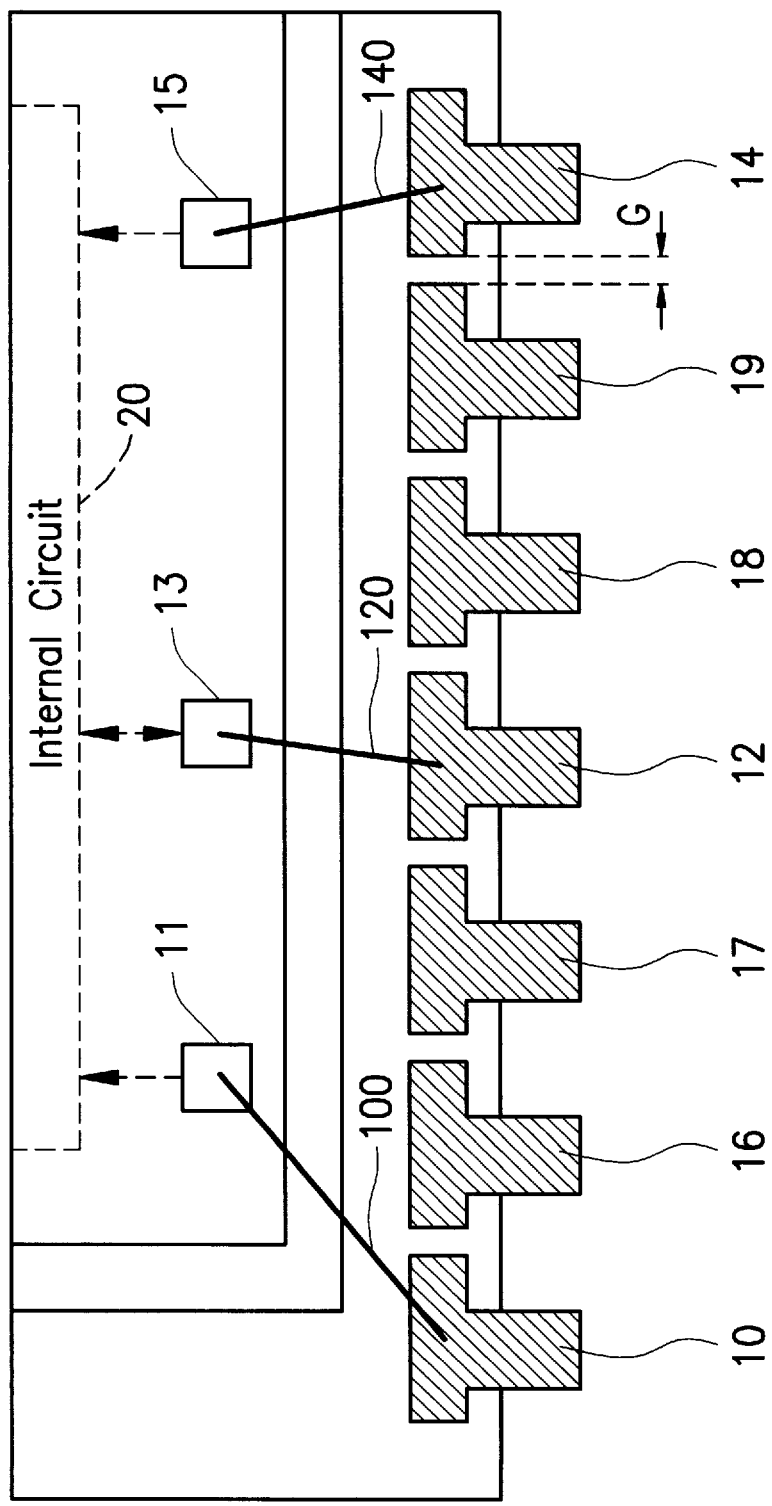
FIG. 1 is a schematic diagram of a conventional IC package, particularly used to depict the cause of ESD damage due to a potential difference between wired and no-connect pins.
Figure 2:
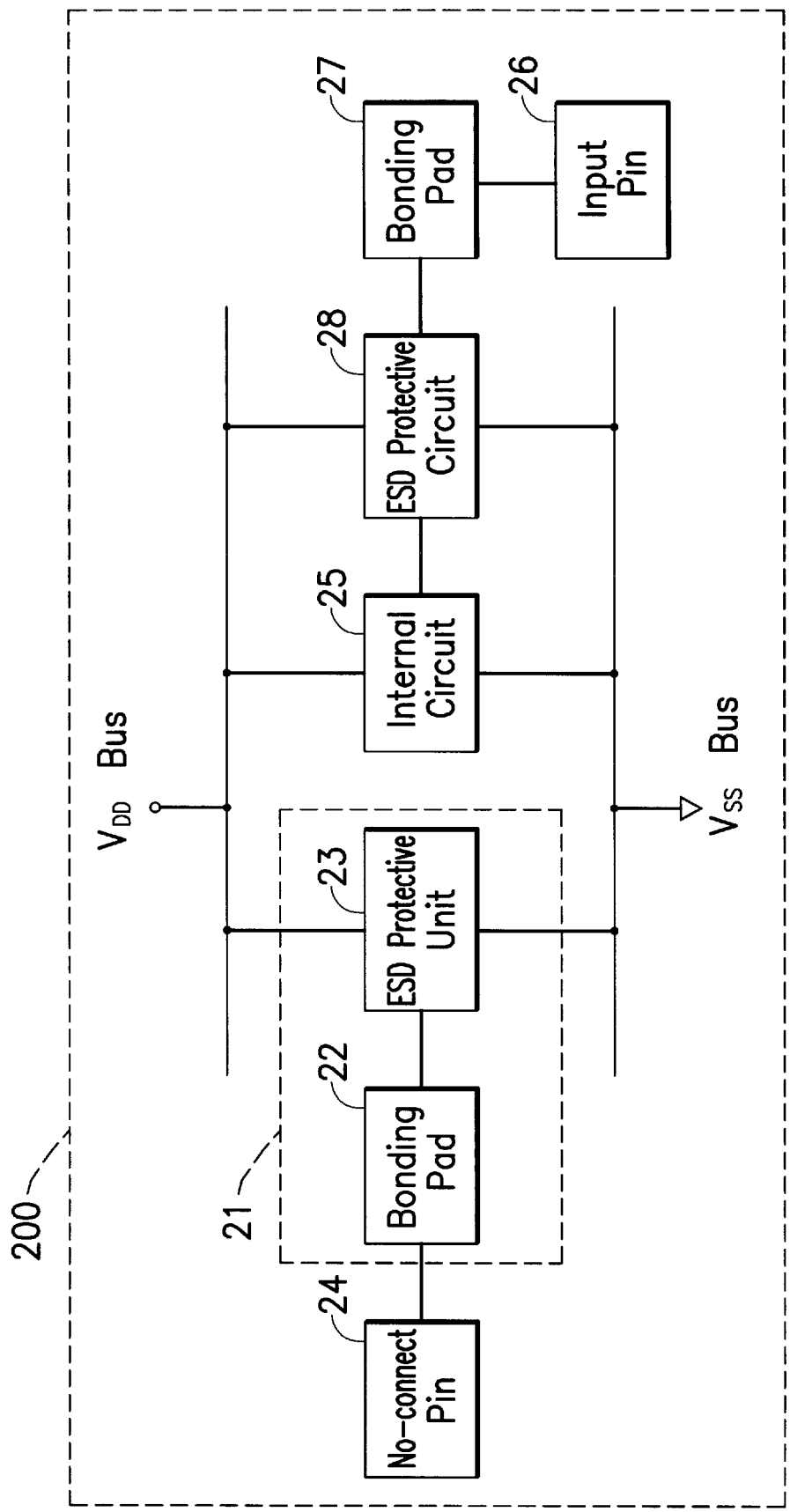
FIG. 2 is a schematic block diagram of an IC package incorporating the ESD protective device according to the invention.

FIG. 2 shows a schematic block diagram of an IC package 200, including an internal circuit 25, at least one no-connect pin 24, and a wired pin 26 connected to a bonding pad 27. A conventional ESD protective circuit 28 is coupled between the internal circuit 25 and the bonding pad 27 corresponding to the wired pin 26, to provide ESD protection with regard to the internal circuit 25.

In accordance with the invention, the no-connect pin 24 is coupled to an ESD protective device 21 which is indicated by a dashed outline box. The ESD protective device 21 includes a bonding pad 22 and an ESD protective unit 23. The bonding pad 22 is connected between the no-connect pin 24 and the ESD protective unit 23, while the ESD protective unit 23 is further coupled to the $V_{DD}$ power bus and the $V_{SS}$ power bus but not directly connected to the internal circuit 25.

When the no-connect pin 24 receives an ESD stress, the ESD current will flow to the bonding pad 22, and will be subsequently diverted by the ESD protective unit 23 to the power bus. In this way, the ESD stress would not cause a reduction in its ESD protective capability with respect to its neighboring wired pins.

Figure 3:
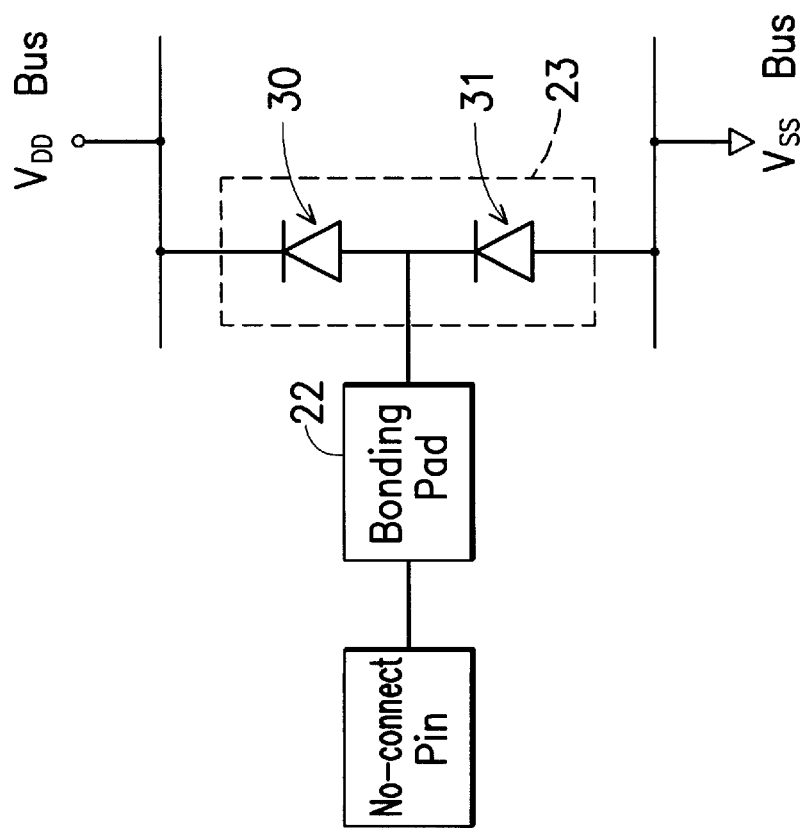
FIG. 3 is a circuit diagram of a first preferred embodiment of the ESD protective device according the invention.

Referring to FIG. 3, there is shown a first preferred embodiment of the ESD protective unit 23, which includes a pull-up diode 30 and a pull-down diode 31. The semiconductor structure of the pull-up diode 30 includes a $p^+$-type diffusion region and an n-well, while the semiconductor structure of the pull-down diode 31 includes an $n^+$-type diffusion region and a p-well. The pull-up diode 30 has a cathode coupled to the $V_{DD}$ power bus and an anode coupled to the cathode of the pull-down diode 31, while the pull-down diode 31 has an anode coupled to the $V_{SS}$ power bus. The bonding pad 22 corresponding to the no-connect pin is coupled to the anode of the pull-up diode 30. The $p^+$-type diffusion region in the pull-up diode 30 and the $n^+$-type diffusion region in the pull-down diode 31 each have an area of 40 μm×10 μm, for example.

Figure 4:
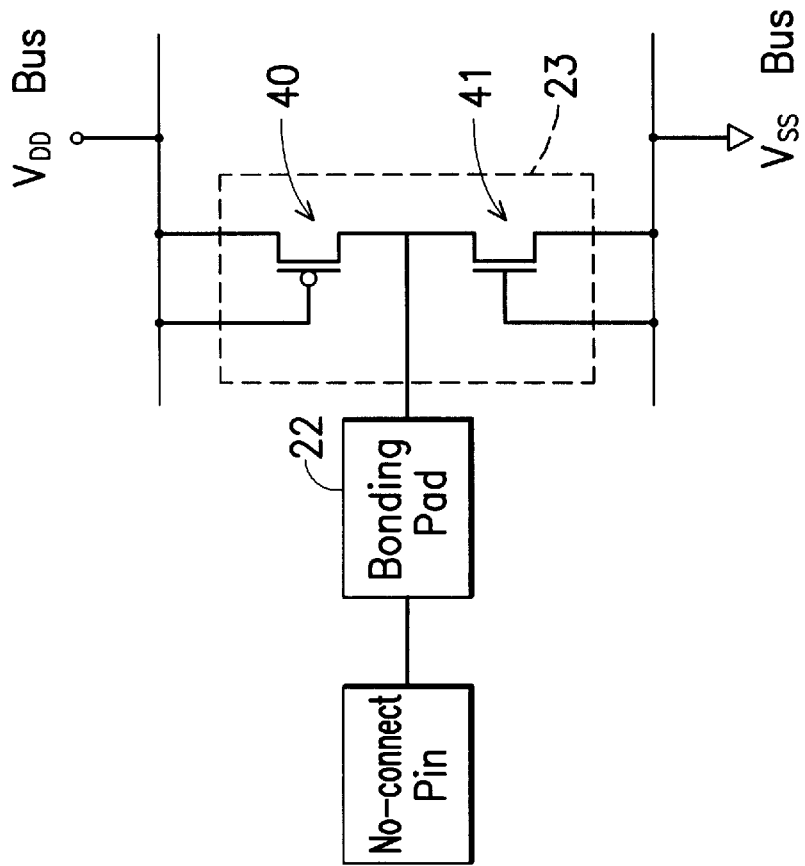
FIG. 4 is a circuit diagram of a second preferred embodiment of the ESD protective device according to the invention.

Referring to FIG. 4, there is shown a second preferred embodiment of the ESD protective unit 23, which includes a pull-up p-type CMOS transistor 40 and a pull-down n-type CMOS transistor 41. The pull-up p-type CMOS transistor 40 has a gate and a source coupled to the $V_{DD}$ power bus and a drain coupled both to the bonding pad 22 corresponding to the no-connect pin and to the drain of the pull-down n-type CMOS transistor 41. The pull-down n-type CMOS transistor 41 has a gate and a source coupled to the $V_{SS}$ power bus. The pull-up p-type CMOS transistor 40 has a channel length of 0.65 μm, for example, and a total channel width of 250 μm, for example; while the pull-down n-type CMOS transistor 41 has a channel length of 0.6 μm, for example, and a total channel width of 250 μm, for example.

Figure 5:
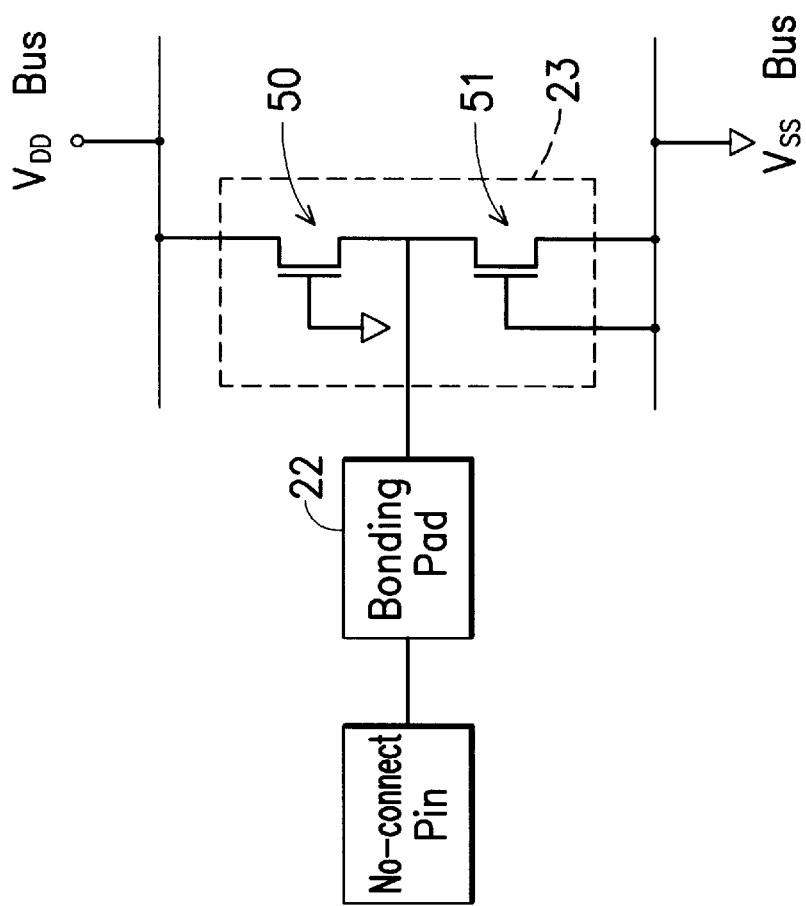
FIG. 5 is a circuit diagram of a third preferred embodiment of the ESD protective device according to the invention.

Referring to FIG. 5, there is shown a third preferred embodiment of the ESD protective unit 23, which includes a pull-up n-type MOS transistor 50 and a pull-down n-type MOS transistor 51. The pull-up n-type MOS transistor 50 has a drain coupled to the $V_{DD}$ power bus, a source coupled both to the bonding pad 22 corresponding to the no-connect pin and to the drain of the pull-down n-type MOS transistor 51, and a gate coupled to the ground. Further, the pull-down n-type MOS transistor 51 has a source and a gate coupled to the $V_{SS}$ power bus. The pull-up n-type MOS transistor 50 and the pull-down n-type type MOS transistor 51 each have a channel length of 0.5 μm, for example, and a total channel width of 200 μm, for example.

Besides the circuit elements utilized by the foregoing embodiments, the ESD protective unit 23 can be implemented through the use of zenor diodes, n-well resistors, polysilicon resistors, diffusion resistors, thin oxide field effect transistors (FETs), thick oxide FETs, low voltage trigger silicon controlled rectifiers (LVTSCRs), or a combination of these devices. The circuit elements chosen must cause an ESD current present at the input to the ESD protective unit to divert the current to the $V_{DD}$ and $V_{SS}$ power buses.

In IC packages, those pins that are used for signal input and/or output and power transmission are referred to as "active pins". According to the invention, each active pin is connected to one ESD protective device 28. Comparing the ESD resistance capability of all the active pins, the power pins ($V_{DD}$ and $V_{SS}$ pins), which are connected respectively to the $V_{DD}$ power bus and the $V_{SS}$ power bus, typically possess the strongest ESD resistance capability. This is because that the $V_{DD}$ power bus and the $V_{SS}$ power bus are usually provided with an ESD protective circuit therebetween, and a capacitance of about 1 nF (nanofarad) to 10 nF exists between the n-well and p-well of this ESD protective circuit, which can absorb quite a large amount of ESD energy. Further, input/output pins and the output pins possess the next strongest ESD resistance capability, whereas the input pins possess the weakest ESD resistance capability. This is because the input/output pins and the output pins are usually connected to output buffers that are part of the ESD protective circuits. Thus, the input/output pins and the output pins usually provide greater ESD protection than the input pins.

As a consequence, if a no-connect pin is arranged next to an input pin, that no-connect pin should be connected by means of a bonding wire to a bonding pad, which will be connected to the ESD protective unit 23 according to the invention. The ESD protective unit 23 together with the bonding pad 22 form the ESD protective device 21. However, if the no-connect pin is arranged next to a $V_{DD}$ pin, a $V_{SS}$ pin, an input/output pin, or an output pin, the connection as described in the foregoing is not necessary for the no-connect pin.

Furthermore, according to the invention, if an input pin is arranged next to a number of successively arranged no-connect pins, each of the no-connect pins should be connected by means of a bonding wire to a bonding pad, which should be connected to an ESD protective unit. However, if the active pin adjacent to those no-connect pins is other than an input pin, the connection as described in the foregoing is not necessary for all of those no-connect pins.

Figure 6:
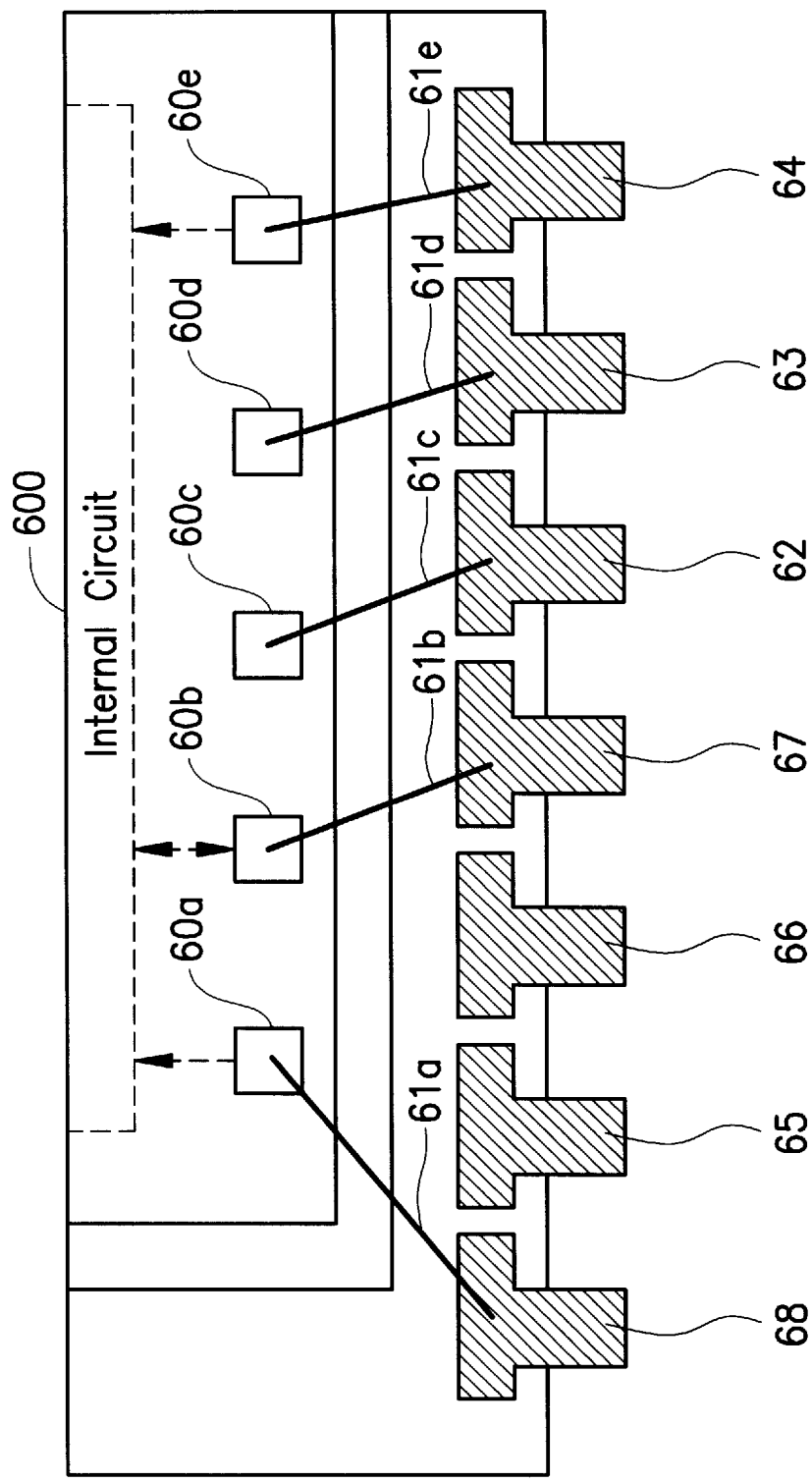
FIG. 6 is a schematic diagram of an IC package incorporating the ESD protective device according to the invention, particularly used to depict the selective connection of no-connect pins to the ESD protective device according to the invention.

Referring to FIG. 6, there is shown an IC package 600 which utilizes the ESD protective device according to the invention. The IC package 600 is provided with a plurality of bonding pads 60a, 60b, 60c, 60d, 60e, and a plurality of pins including, for example, a pair of no-connect pins 62, 63, an input pin 64, another pair of no-connect pins 65, 66, an input/output pin 67, and a $V_{DD}$ pin 68. Since the no-connect pins 62, 63 are successively arranged and the input pin 64 is immediately next to them, the no-connect pins 62, 63 should each be connected by means of a bonding wire 61c, 61d respectively to a bonding pad 60c, 60d respectively, which in turn is connected to an ESD protective unit. As to another pair of no-connect pins 65, 66 which are also successively arranged, since the pin immediately next to them on the right is the input/output pin 67 and the pin immediately next to them on the left is the $V_{DD}$ pin 68, connection of these no-connect pins 65, 66 to the bonding pads 60 is not necessary.

The selective connection of no-connect pins to ESD protective devices according to the invention prevents ESD damage from occurring at the input pins due to ESD stress at the no-connect pins. Although all of the no-connect pins each can be connected to one ESD protective device, this will cause the chip size, as well as manufacturing cost, to increase. Alternatively, one or more successively arranged no-connect pins next to an input pin each can be connected to one ESD protective device, or one or more successively arranged no-connect pins next to an output pin or an input/output pin each can be connected to one ESD protective device. In short, the connections can be devised according to practical requirements.

The invention has been described using exemplary preferred embodiments. However, it is to be understood that the scope of the invention is not be limited to the disclosed preferred embodiments. On the contrary, it is intended to cover various modifications and similar arrangements as would be apparent to those of skill in the art. The scope of the claims should be accorded the broadest interpretation so as to encompass all such modifications and similar arrangements.

What is claimed is:

1. An integrated circuit package comprising at least a power bus, at least an input pin, at least an input/output pin, at least a power pin, an ESD protective device, a first no-connect pin, and a second no-connect pin, wherein said ESD protective device includes
    (a) an ESD protective unit coupled to the power bus; and
    (b) a bonding pad coupled between said ESD protective unit and the first no-connect pin;
    wherein the first no-connect pin is disposed immediately adjacent at least one of the at least an input pin, the second no-connect pin is disposed immediately adjacent the power pin or the input/output pin, and the second no-connect pin is not coupled to the ESD protective unit via a bonding pad.

2. The integrated circuit package of claim 1, further including a number of successively arranged no-connect pins including the first no-connect pin, a number of bonding pads including the bonding pad, and a number of bonding wires, wherein the ESD protective device includes a number of ESD protective units including the ESD protective unit, and wherein each of the number of successively arranged no-connect pins is connected by means of a bonding wire to a bonding pad, and each bonding wire is connected to an ESD protective unit.

3. The integrated circuit package of claim 1, further comprising a third no-connect pin disposed immediately adjacent said first no-connect pin, a second ESD protective device, and a second bonding pad coupled between the third no-connect pin and the second ESD protective device.

4. The integrated circuit package of claim 1, further comprising a number of third no-connect pins each disposed immediately adjacent a first no-connect pin, wherein
    each third no-connect pin is coupled to a bonding pad and an ESD protective device.

5. An integrated circuit package, comprising a number of input pins, a number of first no-connect pins disposed immediately adjacent the input pins, a number of second no-connect pins disposed not immediately adjacent the input, a number of third no-connect pins, each disposed immediately adjacent one of said first no-connect pins, a number of ESD protective devices, a power bus, and a number of bonding pads coupled between said first no-connect pins and said ESD protective devices;
    wherein
    the ESD protective devices are coupled to the power bus and no bonding pad is coupled to said second no-connect pins;

each said first no-connect pin is disposed immediately adjacent one of said input pins;
    each said second no-connect pin is not disposed immediately adjacent said input pins;
    each said first no-connect pin is coupled to one of said bonding pads and one of said ESD protective devices;
    each said second no-connect pin is not coupled to said bonding pads; and
    each said third no-connect pin is coupled to one of said bonding pads and one of said ESD protective devices.

6. The integrated circuit package of claim 5, further comprising a third no-connect pin disposed immediately adjacent said first no-connect pin, a second ESD protective device, and a second bonding pad coupled between the third no-connect pin and the second ESD protective device.

7. An integrated circuit package, comprising a power bus, a plurality of power-bus pins, a first no-connect pin disposed such that the power-bus pins are not located immediately adjacent both sides of the first no-connect pin, a second no-connect pin disposed such that the power bus pins are located immediately adjacent both sides of the second no-connect pin, an ESD protective device coupled to the power bus, and at least one bonding pad coupled between said first no-connect pin and the ESD protective device;
    wherein said second no-connect pin is not coupled to a bonding pad.

8. The integrated circuit package of claim 7, further comprising a third no-connect pin disposed immediately adjacent said first no-connect pin, a second ESD protective device, and a second bonding pad coupled between the third no-connect pin and the second ESD protective device.

9. The integrated circuit package of claim 7, comprising a number of first no-connect pins, a number of second no-connect pins, a number of bonding pads, and a number of ESD protective devices, wherein
    each first no-connect pin is disposed such that the power-bus pins are not located immediately adjacent both sides of each first no-connect pin;
    each second no-connect pin is disposed such that the power-bus pins are located immediately adjacent both sides of each second no-connect pin;
    each first no-connect pin is coupled to a bonding pad and an ESD protective device; and
    each second no-connect pin is not coupled to a bonding pad.

10. The integrated circuit package of claim 9, further comprising a number of third no-connect pins each disposed immediately adjacent a first no-connect pin, wherein
    each third no-connect pin is coupled to a bonding pad and an ESD protective device.

11. The integrated circuit package of claim 7, further comprising a number of third no-connect pins each disposed immediately adjacent a first no-connect pin, wherein
    each third no-connect pin is coupled to a bonding pad and an ESD protective device.

12. An integrated circuit package, comprising at least a wired-IC pin of a first type, a number of first no-connect pins disposed immediately adjacent said wired-IC pin of the first type, a number of second no-connect pins disposed not immediately adjacent said wired-IC pin of the first type, a number of third no-connect pins each disposed immediately adjacent one of said first no-connect pins, a number of ESD protective devices, a power bus, and a number of bonding pads including a first bonding pad coupled between said wired-IC pin of the first type and one of said ESD protective devices and a second bonding pad coupled between one of said first no-connect pins and one of said ESD protective devices;

wherein no bonding pad is coupled to said second no-connect pins;

each said first no-connect pin is disposed immediately adjacent said wired-IC pin of the first type;

each said second no-connect pin is disposed not immediately adjacent said wired-IC pin of the first type;

each said first no-connect pin is coupled to one of said bonding pads and one of said ESD protective devices;

each said second no-connect pin is not coupled to said bonding pads; and each said third no-connect pin is coupled to one of said bonding pads and one of said ESD protective devices.

13. The integrated circuit package of claim 12, further comprising a third no-connect pin disposed immediately adjacent said first no-connect pin, and a third bonding pad coupled between the third no-connect pin and an ESD protective device.

* * * * *